(12) United States Patent
Forbes

(10) Patent No.: US 6,413,825 B1
(45) Date of Patent: Jul. 2, 2002

(54) METHOD FOR SIGNAL PROCESSING

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/560,777

(22) Filed: Apr. 28, 2000

Related U.S. Application Data

(62) Division of application No. 09/145,100, filed on Sep. 1, 1998, now Pat. No. 6,104,068.

(51) Int. Cl.$^7$ ............................................. H01L 21/336
(52) U.S. Cl. ..................... 438/283; 438/212; 438/268; 438/279
(58) Field of Search ............................... 438/283, 279, 438/268, 269, 212

(56) References Cited

U.S. PATENT DOCUMENTS

| | | | | |
|---|---|---|---|---|
| 4,605,909 A | | 8/1986 | Tsironis ........................ | 331/96 |
| 5,006,909 A | * | 4/1991 | Kosa ............................. | 357/41 |
| 5,057,896 A | | 10/1991 | Gotou ........................... | 357/49 |
| 5,391,895 A | | 2/1995 | Dreifus | |
| 5,585,288 A | * | 12/1996 | Davis et al. .................. | 438/38 |
| 5,661,424 A | | 8/1997 | Tang ............................. | 327/105 |

FOREIGN PATENT DOCUMENTS

| | | | | |
|---|---|---|---|---|
| JP | 360116163 A | * | 6/1985 | |
| JP | 4370978 | | 12/1992 | ......... H01L/29/784 |

OTHER PUBLICATIONS

*GaAs IC Symposium, IEEE Gallium Arsenide Integrated Cisuit Symposium, 19th Annual Technical Digest*, Anaheim, California, pp. 1–290, (Oct. 12–15, 1997).

Asai, S., et al., "The GaAs Dual–Gate Fet With Low Noise And Wide Dynamic Range", *Technical Digest, International Electron Devices Meeting*, pp. 64–67, (Dec. 1973).

Colinge, J.P., "Reduction of Kink Effect in Thin–Film SOI MOSFET's", *IEEE Electron Device Letters*, 9(2), pp. 97–99, (1988).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Mizuno, T., et al., "High Speed and Highly Reliable Trench MOSFET with Dual–Gate", *VLSI Symposium Digest*, 23–24, (1988).

Nishinohara, K., et al., "Effects of Microscopic Fluctuations in Dopant Distributions on MOSFET Threshold Voltage", *IEEE Transactions on Electron Devices*, 39(3), pp. 634–639, (Mar. 1992).

Stolk, P.A., et al., "The Effect of Statistical Dopant Fluctuations on MOS Device Performance", *IEEE*, pp. 23.4.1–23.4.4, (1996).

(List continued on next page.)

*Primary Examiner*—Michael Trinh
(74) *Attorney, Agent, or Firm*—Schwegman, Lundberg, Woessner & Kluth, P.A.

(57) ABSTRACT

An improved structure and method are provided for signal processing. The structure includes dual-gated metal-oxide semiconducting field effect transistor (MOSFET). The dual-gated MOSFET can be fabricated according to current CMOS processing techniques. The body region of the dual-gated MOSFET is a fully depleted structure. The structure includes two gates which are positioned on opposite sides of the opposing sides of the body region. Further, the structure operates as one device where the threshold voltage of one gate depends on the bias of the other gate. Thus, the structure yields a small signal component in analog circuit applications which depends on the product of the signals applied to the gates, and not simply one which depends on the sum of the two signals.

52 Claims, 2 Drawing Sheets

OTHER PUBLICATIONS

Takeuchi, K., et al., "Channel Engineering for the Reduction of Random–Dopant–Placement–Induced Threshold Voltage Fluctuations", *IEEE*, pp. 33.6.1–33.6.4, (1997).

Taur, Y., et al., "CMOS Devices below 0.1 micrometer: How High Will Performance Go?", *IEEE*, pp. 9.1.1–9.1.4, (1997).

Wong, H.S., et al., "Self–Aligned (Top and Bottom) Double–Gate MOSFET with a 25 nm Thick Silicon Channel", *IEEE*, pp. 16.6.1–16.6.4, (1997).

Wong, H.S., et al., "Three–Dimensional "Atomistic" Simulation of Discrete Random Dopant Distribution Effects in Sub–0.1 micrometer MOSFET's", *IEEE*, pp., 29.2.1–29.2.4, (1993).

Sze, S.M., *In: Physics of Semiconductor Devices, Second Edition*, Wiley–Interscience Publications, John Wiley & Sons, New York, p. 362–279, 433–438, (1981).

* cited by examiner

METHOD FOR SIGNAL PROCESSING

RELATED APPLICATIONS

This application is a Divisional of U.S. application Ser. No. 09/145,100, filed Sep. 1, 1998, now U.S. Pat. No. 6,104,068.

This application is related to the co-filed and commonly assigned application U.S. application Ser. No. 09/144,202, U.S. Pat. No. 6,320,222, entitled "Structure and Method for Reducing Threshold Voltage Variations Due To Dopant Fluctuations" by inventors Leonard Forbes and Wendell P. Noble, which is hereby incorporated by reference. Further, this application is related to application Ser. No. 08/889,462, entitled "Memory Cell Having A Vertical Transistor with Buried Source/Drain And Dual Gates," filed on Jul. 8, 1997, now U.S. Pat. No. 6,150,687, and application Ser. No. 09/050,281, entitled "Circuits and Methods for Dual-Gated Transistors," filed on Mar. 30, 1998, now U.S. Pat. No. 6,097,065, which applications are also incorporated herein by reference.

FIELD OF THE INVENTION

The present invention relates generally to semiconductor integrated circuits. More particularly, it pertains to the structure and method for improved signal processing.

BACKGROUND OF THE INVENTION

There is a requirement in analog and radio frequency (RF) integrated circuits for devices known as mixers or multipliers which can take the product of two signals, not just the sum or difference as in simple analog amplifiers or analog computers. This enables the construction of variable gain amplifiers, modulators, heterodyne receivers, frequency multipliers, frequency dividers, synthesizers, and a wide variety of other signal processing functions.

Integrated circuits, such as mixers and multipliers, require the use of a nonlinear solid state device. The simplest nonlinear device employed in a signal mixer or multiplier is the diode such as used in TV satellite receivers. The non-linear characteristics of the diode are used to obtain an intermediate frequency from the product of a local oscillator frequency and an input signal frequency. This product yields, besides the original signals, signals at the sum and differences of the local oscillator frequency and an input signal frequency. The intermediate signal frequency at the difference of the local oscillator frequency and an input signal frequency is used for down conversion of the input signal frequency to lower frequencies where it can then be more easily amplified and demodulated to remove the useful information.

Transistors are also used to fabricate integrated circuits which have the mixer and multiplier capability. Often metal-semiconductor field effect transistors (MESFET's) are employed as the nonlinear solid state device. The MESFET is typically referred to as a dual gate FET, as used in RF GaAs integrated circuits. The device structure can be understood in simple terms by considering it to be two FETs in series where dual gates of the MESFET are adjacent to each other and in series between the source and drain. Further, the drain of the first or lower transistor is in contact, internally, with the source of the upper or top device and there is no external contact to this point. The action of this device can be understood by realizing the gate to source voltage of the second or top device depends on the biasing of the gate to source voltage of the lower or bottom device. This results in the operation depending on the product of the signals on the two gates. Such GaAs dual gate FETs are typically used in a wide variety of signal processing functions at high frequencies, e.g., in the gigahertz (GHz) range including, most recently, cellular or wireless telephones.

Wireless or cellular telephones provide a good example of the shortcomings with using MESFETs in digital technology applications. That is, such digital devices require the integration of both RF and digital integrated circuit functions. Integrating analog and digital circuitry requires significant circuitry real estate and involves non-analogous fabrication steps. The push in integrated circuit technology is to develop more and more compact devices through simplified processing routines. It would be ideal to incorporate both analog and digital functions on a single chip while at the same time maintaining streamlined fabrication processes. Thus, there is a need for RF and digital integrated circuits which can be implemented on a single integrated circuit chip, e.g., a single complementary metal oxide semiconductor (CMOS) integrated circuit chip, using analogous fabrication techniques.

SUMMARY OF THE INVENTION

The above-mentioned problems with integrated circuits and other problems are addressed by the present invention and will be understood by reading and studying the following specification. A structure and method which offer improved functionality are provided.

In particular, an illustrative embodiment of the present invention includes a mixer circuit. The mixer circuit has a transistor extending outwardly from a semiconductor substrate. The transistor has a first source/drain region, a body region, and a second source/drain region. The body region has. opposing sidewall surfaces. And, the body region is formed of a fully depleted structure. A first gate is located on a first one of the opposing sidewall surfaces. A second gate is located on a second one of the opposing sidewall surfaces. Further, a local oscillator is coupled to the first gate, and a signal input is coupled to the second gate.

In another embodiment of the present invention, an analog circuit is provided. The analog circuit includes a dual-gated metal-oxide semiconducting field effect transistor (MOSFET) which extends outwardly from a semiconductor substrate. The dual-gated MOSFET has a first and a second source/drain region. The dual-gated MOSFET has a body region which includes opposing sidewall surfaces. The body region is formed of a fully depleted structure. A first gate is located on a first one of the opposing sidewall surfaces. A second gate located on a second one of the opposing sidewall surfaces. Further, a local oscillator can be coupled to the first gate to receive signals from a local oscillator signal and an analog signal input can be coupled to the second gate and provides an input signal to the second gate.

In another embodiment of the present invention, a signal processing integrated circuit is provided which includes both analog and digital circuits. The analog circuit includes a dual-gated metal-oxide semiconducting field effect transistor (MOSFET) which extends outwardly from a semiconductor substrate. The dual-gated MOSFET has a first and a second source/drain region. The daul-gated MOSFET has a body region which includes opposing sidewall surfaces. The body region is formed of a fully depleted structure. A first gate is located on a first one of the opposing sidewall surfaces. A second gate is located on a second one of the opposing sidewall surfaces. Further, a local oscillator can be coupled to the first gate to receive signals from a local oscillator signal and an analog signal input can be coupled to the second gate and provides an input signal to the second gate.

In another embodiment of the present invention, a communication device is provided. The communication device includes a signal processing circuit. The signal processing circuit has a dual-gated metal-oxide semiconducting field effect transistor (MOSFET) which extends outwardly from a semiconductor substrate. The dual-gated MOSFET includes a first and a second source/drain region. The dual-gated MOSFET has a body region which has opposing sidewall surfaces. The body region is formed of a fully depleted structure. A first gate is located on a first one of the opposing sidewall surfaces. A second gate is located on a second one of the opposing sidewall surfaces. Further, a local oscillator is coupled to the first gate and provides a local oscillator signal to the first gate. A signal input is coupled to the second gate and provides an input signal to the second gate. The communication device also includes a receiver and a transmitter which are electrically coupled to the signal processing circuit for receiving and transmitting signals.

Yet another embodiment of the present invention includes a method of signal processing. The method includes biasing a first gate of a dual-gated MOSFET. The dual-gated MOSFET has a first and a second source/drain region. The dual-gated MOSFET has a body region which has opposing sidewall surfaces. The body region is formed from a fully depleted structure. The first gate opposes a first one of the opposing sidewall surfaces. A second gate of the dual-gated MOSFET is similarly biased. The second gate opposes a second one of the opposing sidewall surfaces. The method further includes a local oscillator signal to the first gate and applying an input signal to the second gate.

Thus, an improved structure and method are provided for signal processing. The structure includes a dual-gated metal-oxide semiconducting field effect transistor (MOSFET). The dual-gated MOSFET can be fabricated according to current CMOS processing techniques. The body region of the dual-gated MOSFET is a fully depleted structure. The structure includes two gates which are positioned on opposite sides of the opposing sides of the body region. Further, the structure operates as one device where the threshold voltage of one gate depends on the bias of the other gate. Thus, the structure yields a small signal component in analog circuit applications which depends on the product of the signals applied to the gates, and not simply one which depends on the sum of the two signals.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1B:
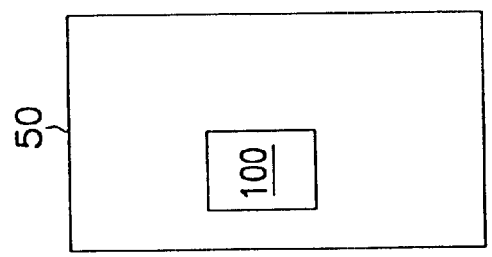
FIG. 1B is a block diagram illustrating the incorporation of the RF circuit of FIG. 1A into a signal processing integrated circuit 50 according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n- and p-type semiconductor materials, respectively.

Figure 1A:
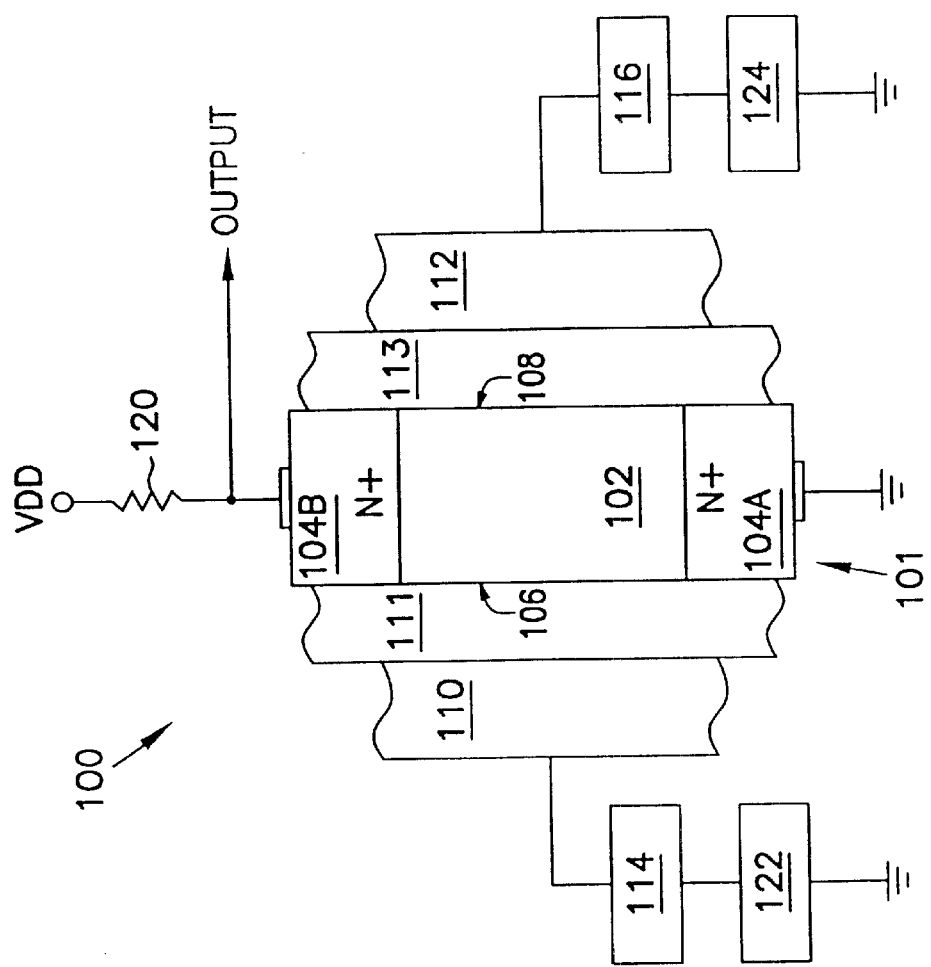
FIG. 1A is a diagram of an analog or RF circuit according to the teachings of the present invention.

FIG. 1A is a diagram of an analog or RF circuit 100 according to the teachings of the present invention. FIG. 1B is a block diagram illustrating the incorporation of the RF circuit 100 into a signal processing integrated circuit 50 according to the teachings of the present invention. The RF circuit 100 and digital integrated circuits are implemented on a single integrated circuit using, for example but not by way of limitation, a single complementary metal oxide semiconductor (CMOS) fabrication technique to form a signal processing integrated circuit 50. Those skilled in the art will readily recognize that other semiconductor fabrication techniques may be used to implement the present invention. Thus, signal processing integrated circuit 50 includes both analog and digital circuits on a single die or substrate.

The RF circuit 100 may include a mixer circuit, a frequency multiplier, a heterodyne receiver, or any equivalent analog circuit structure. The RF circuit 100 includes a dual-gated metal-oxide semiconducting field effect transistor (MOSFET) 101, or transistor 101. In one embodiment, the dual-gated MOSFET is a vertical MOSFET such as, for example, the vertical MOSFET shown and described in co-pending application Ser. No. 08/889,462, entitled "Memory Cell Having A Vertical Transistor with Buried Source/Drain And Dual Gates," filed on Jul. 8, 1997, which application is incorporated herein by reference. In an alternative embodiment, the dual-gated MOSFET is a lateral MOSFET such as, for example, the lateral MOSFET shown and described in co-pending application Ser. No. 09/050,281, entitled "Circuits and Methods for Dual-Gated Transistors," filed on Mar. 30, 1998, which application is incorporated herein by reference. The dual-gated MOSFET 101 extends outwardly from a substrate and includes a first and a second source/drain region, 104A and 104B respectively. The dual-gated MOSFET includes a body region 102 which has opposing sidewall surfaces, 106 and 108 respectively. The body region 102 is formed with appropriate doping concentrations and with an appropriately narrow width between the opposing sidewall surfaces, 106 and 108, such that body region can be fully depleted during MOSFET operation. A first gate 110 is located on, and opposes, a first one 106 of the opposing sidewall surfaces, 106 and 108 respectively. A second gate 112 is located on, and opposes, a second one 108 of the opposing sidewall surfaces, 106 and 108 respectively. The threshold voltage (V) of the first gate 110 is dependent on the potential applied to the second gate 112.

The first gate 110 is separated from the first one 106 of the opposing sidewall surfaces, 106 and 108, of the body region 102 by a thin oxide layer 111. The second gate 112 is separated from the second one 108 of the opposing sidewall surfaces, 106 and 108, of the body region 102 by another thin oxide layer 113. A local oscillator 114 is coupled to the first gate 110 and provides a local oscillator signal to the first gate 110. A signal input 116 is coupled to the second gate 112 and provides an input signal to the second gate 112. In one embodiment, the signal input 116 provides input signals having frequencies in the gigahertz (GHz) range to the second gate 112. In an alternate embodiment, the signal input 116 provides input signals having frequencies in the megahertz (MHZ) range to the second gate 112.

Additionally, as illustrated in FIG. 1A, a first dc source 122 is coupled to the first gate 110. Similarly, a second dc source 124 is coupled to the second gate 112. In one embodiment, the first dc source 122 and the second dc source 124 are distinct dc sources. In an alternative embodiment, the first dc source 122 and the second dc source 124 are a single source. In one embodiment, illustrated by FIG. 1B, the RF or analog circuit 100 is an integral component of, and coupled to, an integrated circuit chip 50 and that integrated circuit chip 50 is adapted to processing digital and analog signals. In a further embodiment, the integrated circuit chip 50 includes a complementary metal-oxide semiconductor (CMOS) chip upon which the RF or analog circuit 100 is fabricated.

Figure 2:
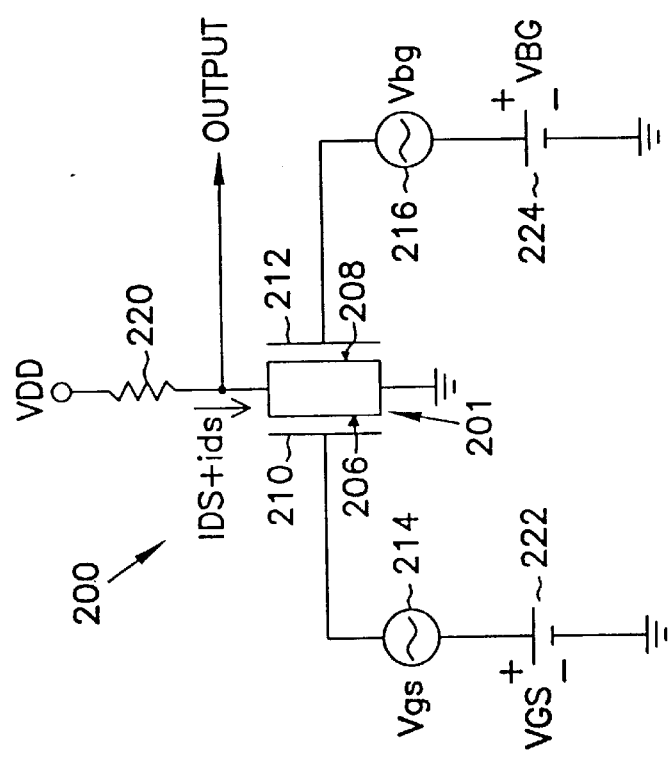
FIG. 2 is a schematic diagram illustrating an embodiment of the signal processing circuit of FIG. 1A.

FIG. 2 is a schematic diagram illustrating an embodiment 200 of the RF circuit 100 of FIG. 1A. The method of operation of the structural embodiment of FIG. 1A is described in connection with the schematic diagram of FIG. 2. FIG. 2 illustrates that the operation of the RF circuit 200 employs the use of a dual-gated MOSFET 201. The dual-gated MOSFET 201 includes the structure of the dual-gated MOSFET presented and described in connection with FIG. 1A. The dual-gated MOSFET 201 has a first gate 210 opposing a first one 206 of the dual-gated MOSFET's 201 opposing sidewall surfaces, 206 and 208 respectively. The dual-gated MOSFET 201 further includes a second gate 212 opposing a second one 208 of the dual-gated MOSFET's 201 opposing sidewall surfaces, 206 and 208.

The method of operation includes biasing the first gate 210 of the dual-gated MOSFET 201. In one embodiment, the first gate 210 is biased by a first dc voltage source 222. In an alternative embodiment, any other suitable biasing means may be employed. Further, the second gate 212 is similarly biased using a second dc voltage source 224. In one embodiment, biasing the second gate 212 includes biasing the second gate 212 prior to biasing the first gate 210. In an alternative embodiment, the first gate 210 and the second gate 212 are biased using a single biasing means. The threshold voltage ($V_t$) of the first, or front, gate 210 to source voltage, VGS, of this device is a function of the second, or back, gate 212 to source voltage, VBG. Alternatively stated, biasing the second gate 212 has the effect of shifting the threshold voltage ($V_t$) of the first gate 210. When the dual-gated MOSFET 201 is turned on, e.g., VGS greater than $V_t$, the dual-gated MOSFET 201 is biased sufficiently to position the operation of the dual-gated MOSFET 201 in the non-linear region of the transistor. The drain current of the dual-gated MOSFET, IDS, is a function of the capacitance of the gate oxides and the potentials VGS and VBG, at the front and back gates, 210 and 212 respectively. A local oscillator signal, Vgs, having a first frequency is applied by a local oscillator 214 to the first, or front, gate 210. An input signal, Vbg, having a second frequency is applied by a signal input 216 to the second, or back, gate 212. Superimposing, or applying, the local oscillator signal, Vgs, and the input signal, Vbg, upon the dc biases already applied to the first and second gates, 210 and 212 respectively, creates a small signal drain current, ids. The ids signal will include frequency terms, w1 and w2, representing the product of the two signals, Vgs and Vbg. This action achieves the multiplier or mixer action. Using a trigonometric identity the product term can be shown to be composed of signals at the difference of the frequencies, w2−w1, and the sum of the frequencies, w2+w1. Terms involving the square of the signals, $Vgs^2$ and $Vbg^2$ can be shown using another trigonometric identity to represent frequency doubling. Hence, the operation of the RF or analog circuit 200 can be used in a wide variety of signal processing functions.

In effect, the method of driving the first and second gates, 210 and 212, in the fashion set forth above results in the dual-gated MOSFET 201 outputting an intermediate frequency at the drain region, or the second source/drain region as described in connection with the structure of FIG. 1A. This intermediate frequency signal is then a combination of the collective signals provided to the first and second gates, 210 and 212 of the dual-gated MOSFET. Moreover, a number of different intermediate frequencies will be outputted from the dual-gated MOSFET 201 dependent upon the variation of the collective signals provided to the first and second gates, 210 and 212. The number of intermediate frequency signals output at the drain includes the product of the local oscillator signal and the input signal, the difference of the local oscillator signal and the input signal, and the sum of the local oscillator signal and the input signal. The method of configuring relevant circuitry to isolate these stated intermediate frequencies will be understood by one of ordinary skill in the art of signal processing upon reading of this specification.

Further, under an embodiment of operation in the present invention, applying an input signal to a second gate 212 includes applying an input signal having a frequency in the gigahertz (GHz) range. According to an alternative embodiment, applying an input signal to a second gate 212 includes applying an input signal having a frequency in the megahertz (MHZ) range.

Figure 3:
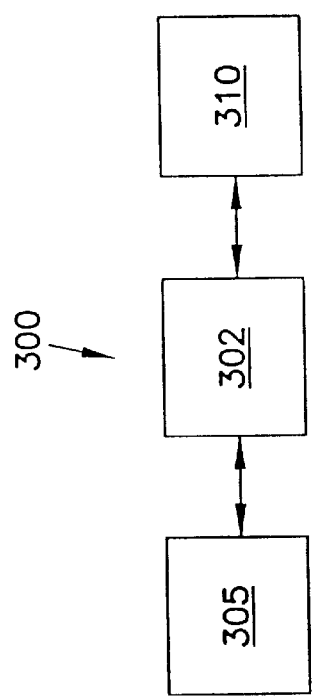
FIG. 3 is a block diagram illustrating a communication device according to an embodiment of the present invention.

FIG. 3 is a block diagram illustrating a communication device 300 according to an embodiment of the present invention. The communication device 300 includes the signal processing circuit 302 presented and described above in connection with FIGS. 1 and 2 as including signal processing integrated circuit 50 having an RF or analog portion 100 or 200. Further, the signal processing circuit 302 is electrically coupled to either a transmitter 305 or a receiver 310 or both and adapted to receiving and/or transmitting signals. The structure and method by which the transmitter 305 and the receiver 310 can be electrically coupled to the signal processing circuit 302 will be understood by one of ordinary skill in the art of signal processing upon reading of this specification. Accordingly, the detailed aspects of the transmitter 305 and the receiver 310 are not presented here.

Conclusion

An improved structure and method are provided for a signal processing circuit. The signal processing circuit is fabricated using current CMOS processing techniques. The structure includes dual-gated MOSFET, which means a fully depleted dual-gated MOSFET that has two gates one on each side of a thin, fully depleted silicon structure. The silicon film between the two gates is very thin so the device can be fully depleted. The dual-gated MOSFET is not simply two distinctly different FETs operating in parallel, but rather the threshold voltage of one gate of the dual-gated MOSFET depends on the bias of the other gate. Thus, the daul-gated MOSFET operates as one singular device structure where the current depends on the potential of both the front gate and the back gate. This yields a small signal component in analog circuit applications which depends on the product of the signals applied to the gates, and not one which depends on the sum of the two signals.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of fabricating a signal processing integrated circuit, comprising:
   fabricating a metal oxide semiconductor digital logic circuit; and
   concurrently fabricating a transistor for an analog circuit on the same single integrated circuit, including:
      forming a first source/drain region on a substrate;
      laterally forming a body region on the first source/drain region, wherein the body region includes opposing sidewall surfaces;
      forming a second source/drain region on the body region;
      forming a first gate on a first one of the opposing sidewall surfaces; and
      forming a second gate on a second one of the opposing sidewall surfaces.

2. The method of claim 1, further including:
   doping the body region so that the body region is capable of being fully depleted.

3. A method of fabricating an integrated circuit, comprising:
   fabricating a metal oxide semiconductor digital logic circuit; and
   concurrently fabricating a transistor for an analog circuit, on the same single integrated circuit, including:
      forming a first source/drain region on a substrate;
      vertically forming a body region on the first source/drain region, wherein the body region includes opposing sidewall surfaces;
      forming a second source/drain region on the body region;
      forming a first gate on a first one of the opposing sidewall surfaces; and
      forming a second gate on a second one of the opposing sidewall surfaces.

4. A method of fabricating a semiconductor integrated circuit, comprising:
   fabricating a metal oxide semiconductor digital logic circuit; and
   concurrently fabricating a transistor for an analog circuit, on the same single integrated circuit, including:
      forming a first source/drain region on a substrate;
      forming a second source/drain region on a substrate;
      forming a channel region between the first and second source/drain region, wherein the body region includes opposing sidewall surfaces;
      forming a first gate on a first one of the opposing sidewall surfaces; and
      forming a second gate on a second one of the opposing sidewall surfaces.

5. The method of claim 4, further comprising:
   coupling a local oscillator to the first gate; and
   coupling a signal input to the second gate.

6. The method of claim 5, wherein coupling a signal input to the second gate comprises coupling a GHz signal input to the second gate.

7. The method of claim 5, further comprising:
   coupling a first DC source to the first gate;
   coupling a second DC source to the second gate; and
   biasing the channel region of the transistor using the first and second DC sources.

8. The method of claim 7, wherein biasing the channel region of the transistor using the first and second DC sources comprises biasing the channel region to a non-linear region.

9. The method of claim 5, further comprising:
   coupling a single DC source to the first and second gates; and
   biasing the channel region of the transistor using the single DC source.

10. The method of claim 9, wherein biasing the channel region of the transistor using the single DC source comprises biasing the channel region to a non-linear region.

11. A method of fabricating a semiconductor integrated circuit, comprising:
    fabricating a metal oxide semiconductor digital logic circuit using a CMOS process; and concurrently fabricating a transistor for an analog circuit, on the same single integrated circuit using a CMOS process, including:
  forming a first source/drain region on a substrate;
  vertically forming a body region on the first source/drain region, wherein the body region includes opposing sidewall surfaces;
  forming a second source/drain region on the body region;
  forming a first gate on a first one of the opposing sidewall surfaces; and
  forming a second gate on a second one of the opposing sidewall surfaces.

12. The method of claim 11, further comprising:
  coupling a local oscillator to the first gate; and
  coupling a signal input to the second gate.

13. The method of claim 12, wherein coupling a signal input to the second gate comprises coupling a GHz signal input to the second gate.

14. The method of claim 12, further comprising:
  coupling a first DC source to the first gate;
  coupling a second DC source to the second gate; and
  biasing the body region of the transistor using the first and second DC sources.

15. The method of claim 14, wherein biasing the body region of the transistor using the first and second DC sources comprises biasing the body region to a non-linear region.

16. The method of claim 12, further comprising:
  coupling a single DC source to the first and second gates; and
  biasing the body region of the transistor using the single DC source.

17. The method of claim 16, wherein biasing the body region of the transistor using the single DC source comprises biasing the body region to a non-linear region.

18. A method of fabricating a semiconductor integrated circuit, comprising:
  fabricating a metal oxide semiconductor digital logic circuit using a CMOS process; and
  concurrently fabricating a transistor for an analog circuit, on the same single integrated circuit using a CMOS process, including:
    forming a first source/drain region on a substrate;
    forming a second source/drain region on a substrate;
    forming a channel region between the first and second source/drain region, wherein the body region includes opposing sidewall surfaces;
    forming a first gate on a first one of the opposing sidewall surfaces; and
    forming a second gate on a second one of the opposing sidewall surfaces.

19. The method of claim 18, further comprising:
  coupling a local oscillator to the first gate; and
  coupling a signal input to the second gate.

20. The method of claim 19, wherein coupling a signal input to the second gate comprises coupling a GHz signal input to the second gate.

21. The method of claim 19, further comprising:
  coupling a first DC source to the first gate;
  coupling a second DC source to the second gate; and
  biasing the channel region of the transistor using the first and second DC sources.

22. The method of claim 21, wherein biasing the channel region of the transistor using the first and second DC sources comprises biasing the channel region to a non-linear region.

23. The method of claim 19, further comprising:
  coupling a single DC source to the first and second gates; and
  biasing the channel region of the transistor using the single DC source.

24. The method of claim 23, wherein biasing the channel region of the transistor using ingle DC source comprises biasing the channel region to a non-linear region.

25. A method of fabricating a transistor device, comprising:
  fabricating a metal oxide semiconductor digital logic circuit; and
  concurrently fabricating a number of transistors for an analog circuit, on the same single integrated circuit, wherein forming each transistor includes:
    forming a first source/drain region on a substrate;
    vertically forming a body region on the first source/drain region, wherein the body region includes opposing sidewall surfaces;
    forming a second source/drain region on the body region;
    forming a first gate on a first one of the opposing sidewall surfaces; and
    forming a second gate on a second one of the opposing sidewall surfaces.

26. The method of claim 25, further comprising:
  coupling a local oscillator to the first gate of one of the number of transistors; and
  coupling a signal input to the second gate of one of the number of transistors.

27. The method of claim 26, wherein coupling a signal input to the second gate comprises coupling a GHz signal input to the second gate.

28. The method of claim 26, further comprising:
  coupling a first DC source to the first gate;
  coupling a second DC source to the second gate; and
  biasing the body region of the transistor using the first and second DC sources.

29. The method of claim 28, wherein biasing the body region of the transistor using the first and second DC sources comprises biasing the body region to a non-linear region.

30. The method of claim 26, further comprising:
  coupling a single DC source to the first and second gates; and
  biasing the body region of the transistor using the single DC source.

31. The method of claim 30, wherein biasing the body region of the transistor using the single DC source comprises biasing the body region to a non-linear region.

32. A method of fabricating a transistor device, comprising:
  fabricating a metal oxide semiconductor digital logic circuit; and
  concurrently fabricating a number of transistors for an analog circuit, on the same single integrated circuit, wherein forming each transistor includes:
    forming a first source/drain region on a substrate;
    forming a second source/drain region on a substrate;
    forming a channel region between the first and second source/drain region, wherein the body region includes opposing sidewall surfaces;
    forming a first gate on a first one of the opposing sidewall surfaces; and
    forming a second gate on a second one of the opposing sidewall surfaces.

33. The method of claim 32, further comprising:
coupling a local oscillator to the first gate of one of the number of transistors; and
coupling a signal input to the second gate of one of the number of transistors.

34. The method of claim 33, wherein coupling a signal input to the second gate comprises coupling a GHz signal input to the second gate.

35. The method of claim 33, further comprising:
coupling a first DC source to the first gate;
coupling a second DC source to the second gate; and
biasing the channel region of the transistor using the first and second DC sources.

36. The method of claim 35, wherein biasing the channel region of the transistor using the first and second DC sources comprises biasing the channel region to a non-linear region.

37. The method of claim 33, further comprising:
coupling a single DC source to the first and second gates; and
biasing the channel region of the transistor using the single DC source.

38. The method of claim 37, wherein biasing the channel region of the transistor using the single DC source comprises biasing the channel region to a non-linear region.

39. A method of fabricating a semiconductor communications device, comprising:
forming a receiver;
forming a signal processing device, comprising:
fabricating a metal oxide semiconductor digital logic circuit; and
concurrently fabricating a transistor for an analog circuit, on the same single integrated circuit, including:
forming a first source/drain region on a substrate;
vertically forming a body region on the first source/drain region, wherein the body region includes opposing sidewall surfaces;
forming a second source/drain region on the body region;
forming a first gate on a first one of the opposing sidewall surfaces;
forming a second gate on a second one of the opposing sidewall surfaces; and
coupling the signal processing device to the receiver.

40. The method of claim 39, further comprising:
coupling a local oscillator to the first gate; and
coupling a signal input to the second gate.

41. The method of claim 40, wherein coupling a signal input to the second gate comprises coupling a GHz signal input to the second gate.

42. The method of claim 40, further comprising:
coupling a first DC source to the first gate;
coupling a second DC source to the second gate; and
biasing the body region of the transistor using the first and second DC sources.

43. The method of claim 42, wherein biasing the body region of the transistor using the first and second DC sources comprises biasing the body region to a non-linear region.

44. The method of claim 40, further comprising:
coupling a single DC source to the first and second gates; and
biasing the body region of the transistor using the single DC source.

45. The method of claim 44, wherein biasing the body region of the transistor using the single DC source comprises biasing the body region to a non-linear region.

46. A method of fabricating a semiconductor communications device, comprising:
forming a receiver;
forming a signal processing device, comprising:
fabricating a metal oxide semiconductor digital logic circuit; and
concurrently fabricating a transistor for an analog circuit, on the same single integrated circuit, including:
forming a first source/drain region on a substrate;
forming a second source/drain region on a substrate;
forming a channel region between the first and second source/drain region, wherein the body region includes opposing sidewall surfaces;
forming a first gate on a first one of the opposing sidewall surfaces;
forming a second gate on a second one of the opposing sidewall surface; and
coupling the signal processing device to the receiver.

47. The method of claim 46, further comprising:
coupling a local oscillator to the first gate; and
coupling a signal input to the second gate.

48. The method of claim 47, wherein coupling a signal input to the second gate comprises coupling a GHz signal input to the second gate.

49. The method of claim 47, further comprising:
coupling a first DC source to the first gate;
coupling a second DC source to the second gate; and
biasing the channel region of the transistor using the first and second DC sources.

50. The method of claim 49, wherein biasing the channel region of the transistor using the first and second DC sources comprises biasing the channel region to a non-linear region.

51. The method of claim 47, further comprising:
coupling a single DC source to the first and second gates; and
biasing the channel region of the transistor using the single DC source.

52. The method of claim 51, wherein biasing the channel region of the transistor using the single DC source comprises biasing the channel region to a non-linear region.

* * * * *